United States Patent [19]
Kuster et al.

[11] Patent Number: 5,637,148
[45] Date of Patent: Jun. 10, 1997

[54] APPARATUS FOR COATING BOARD-SHAPED PIECE MATERIAL ON BOTH SIDES

[75] Inventors: Kaspar Kuster, Basel; Anton Rüegge, Allschwil, both of Switzerland

[73] Assignee: Ciba Specialty Chemicals Corporation, Tarrytown, N.Y.

[21] Appl. No.: 529,467

[22] Filed: Sep. 18, 1995

Related U.S. Application Data

[63] Continuation of Ser. No. 125,385, Sep. 22, 1993, abandoned.

[30] Foreign Application Priority Data

Sep. 28, 1992 [EP] European Pat. Off. ............. 92810731

[51] Int. Cl.$^6$ .............. B05C 11/00; B05C 13/00
[52] U.S. Cl. .............. 118/64; 118/66; 118/314; 118/324; 118/503; 198/404; 34/190
[58] Field of Search .............. 118/64, 66, 300, 118/313, 314, 324, 503, DIG. 4; 198/817, 404, 473.1, 803.11, 801; 34/189, 190, 216, 217

[56] References Cited

U.S. PATENT DOCUMENTS

| | | | |
|---|---|---|---|
| 2,005,492 | 6/1935 | Becker | 198/404 |
| 3,112,723 | 12/1963 | Potocki | 118/300 |
| 3,986,476 | 10/1976 | Yano et al. | 118/2 |
| 4,344,380 | 8/1982 | Matsumiya et al. | 118/66 |
| 4,559,896 | 12/1985 | Bossard et al. | 118/300 |
| 4,754,869 | 7/1988 | De Anda | 198/817 |
| 4,757,892 | 7/1988 | Wenger | 198/404 |
| 4,926,789 | 5/1990 | Wenger et al. | 118/668 |
| 4,949,665 | 8/1990 | Weber | 118/DIG. 4 |
| 5,009,306 | 4/1991 | Roderick et al. | 198/817 |
| 5,113,701 | 5/1992 | Martin | 118/58 |
| 5,113,785 | 5/1992 | Martin | 118/58 |
| 5,145,055 | 9/1992 | Kondo | 198/817 |
| 5,339,537 | 8/1994 | Kuster | 34/189 |
| 5,462,599 | 10/1995 | Kuster | 118/314 |

FOREIGN PATENT DOCUMENTS

| | | |
|---|---|---|
| 0542684 | 5/1993 | European Pat. Off. . |
| 3047578 | 9/1981 | Germany . |
| 8704584 | 7/1987 | WIPO . |
| 9215403 | 9/1992 | WIPO . |

OTHER PUBLICATIONS

WPI ICC No: 93-161129/20.

Primary Examiner—Donald E. Czaja
Assistant Examiner—Steven P. Griffin
Attorney, Agent, or Firm—William A. Teoli, Jr.; David R. Crichton

[57] ABSTRACT

A method and an apparatus for coating printed circuit boards on both sides are described in which the printed circuit boards are transported through several consecutive processing stations of a coating installation. In a first coating station, one side of the printed circuit boards is wet-coated with preferably UV-hardenable plastics and the printed circuit boards are subjected to vapour-removal and drying in a first vapour-removal and drying station. The printed circuit boards are turned and, in a second coating station, their second side is wet-coated with preferably UV-hardenable plastics and then are subjected to vapour-removal and drying in a second vapour-removal and drying station. The boards are finally transferred from the coating installation to other processing apparatuses for further processing. In the coating operation, the printed circuit boards are transported in opposite directions through the two coating stations which are arranged side by side in two parallel lines of apparatus. The first vapour-removal and drying station is so arranged between the first and the second coating stations that its longitudinal extent is transverse to the transport directions of the printed circuit boards in the coating stations. Holding devices for the printed circuit boards, which devices are secured to the ascending section of a circulating conveyor, preferably a chain conveyor, extend transversely to the first apparatus line while holding devices that are secured to the descending section of the circulating conveyor extend transversely to the second apparatus line.

8 Claims, 3 Drawing Sheets

APPARATUS FOR COATING BOARD-SHAPED PIECE MATERIAL ON BOTH SIDES

This application is a continuation, of application Ser. No. 08/125,385, filed Sep. 22, 1993 now abandoned.

BACKGROUND OF THE INVENTION

The present invention relates to a method and to an apparatus for coating board-shaped piece material, especially printed circuit boards, on both sides.

After they have been provided with conductors, printed circuit boards are coated with a protective layer. The protective layer is a preferably UV-hardenable photographically exposable plastics material, lacquer or the like. After drying of the protective layer, it is exposed in a suitable form and developed at the exposed sites. The conductors are then free at those sites and can be electrically contacted. In the case of printed circuit boards that are provided with conductors on both sides, the second surface of the boards is also coated and treated analogously to the first surface. The printed circuit boards are coated in a coating installation which comprises a series of processing stations through which the printed circuit boards to be coated pass in succession.

The previously cleaned printed circuit boards are transported to the entrance of a coating station in which one side of the printed circuit boards is provided with a protective layer. The coating station comprises a pouring table with a free-falling pouring curtain under which the printed circuit boards are transported with the surface to be coated uppermost. If desired or necessary, a preheating station is arranged upstream of the coating station. There the previously cleaned printed circuit boards are preheated in a stream of hot air before being coated. From the preheating station, which is generally constructed as a circulating oven, the printed circuit boards are transferred to the coating station. When the first side has been coated, the printed circuit boards are transported to a vapour-removal and drying station arranged following the coating station. In the vapour-removal and drying station, hot air is passed over the coated surface of the printed circuit boards. In that manner, solvent contained in the coating is evaporated (removed by a current of air) and suctioned off, and the coated surface is at least partially dried. In the case of the known coating installations for coating printed circuit boards on both sides, the printed circuit boards are also turned in the vapour-removal and drying station so that the coated surface of the printed circuit board is facing downwards when it reaches the exit of the station while the side of the printed circuit board that has not yet been coated faces upwards and can be coated. For that purpose, the printed circuit boards are again transported under a pouring curtain of a coating station, are coated and finally subjected to vapour-removal and drying in a vapour-removal and drying station. The printed circuit boards, which have now been coated and dried on both sides, are then transported to other processing stations.

A coating installation constructed for coating printed circuit boards on both sides is described, for example, in U.S. Pat. No. 4,926,789. In this known coating installation, a second coating station and a second vapour-removal and drying station are arranged following the first coating station and the first vapour-removal and drying station. The printed circuit boards turned in the fast vapour-removal and drying station are transported with the as yet uncoated surface uppermost under the free-falling pouring curtain of the second coating station. Then, in the second vapour-removal and drying station, they are transported through one or two series-arranged circulating vapour-removal driers. Hot air is again conveyed over the coated surfaces in order to evaporate (remove by a current of air) solvent contained in the coating, the solvent is removed by suction and the printed circuit boards are dried. All of the processing stations of that coating installation for coating printed circuit boards on both sides are arranged in a line one behind the other. Although the pre-drying station and the vapour-removal and drying stations are generally constructed as vertical circulating driers, the overall length of the installation is nevertheless considerable. Accordingly, only relatively long industrial sheds are suitable as installation sites.

U.S. Pat. No. 5, 113,785 and 5,113,701 describe coating installations that permit printed circuit boards to be coated on one or both sides, as desired. The described coating installations comprise only a single coating station and a single vapour-removal and drying station, which is preferably constructed as a vertical circulating drier. If the printed circuit boards are to be coated on both sides, then, after being turned, they are again transported under the pouring curtain of the first coating station and then subjected to vapour-removal and drying in the single vapour-removal and drying station.

In the case of the installation described in U.S. Pat. No. 5,113,785, the coating station and the vapour-removal and drying station are arranged side by side in the longitudinal direction of the installation. Arranged upstream and downstream of the coating station and the vapour-removal and drying station are transverse conveyors which transfer the printed circuit boards from the transport line with the coating station to the adjacent transport line with the vapour-removal and drying station. For example, lifting belts that are arranged transversely to the longitudinal direction of the coating installation are used as transverse conveyors. In a second variant, U.S. Pat. No. 5,113,785 proposes lifting and pivoting rakes as transverse conveyors, which rakes transfer the printed circuit boards from the transport line with the coating station into the adjacent transport line with the vapour-removal and drying station and vice versa. By arranging the coating station and the vapour-removal and drying station side by side instead of one behind the other, the overall length of the coating installation is markedly reduced. However, additional transverse conveyors are required to transfer the printed circuit boards from the first transport line to the second, adjacent transport line. Those transverse conveyors are relatively complicated in terms of construction and require an exact matching of their functioning to the operating rhythm of the vapour-removal and drying station, on the one hand, and to that of the coating station, on the other.

The coating installation described in U.S. Pat. No. 5,113,701 is constructed in a single line and requires no additional transverse conveyors. In that integrated installation, the vapour-removal and drying station is arranged substantially above the coating station. The printed circuit boards which have been coated on one or both sides are subjected to vapour-removal and dried while they are being transported in specially constructed holding devices above the coating station back to the entrance to the coating station or to the exit of the coating installation. Apart from the requirement for special holding means for the printed circuit boards, that coating installation has a relatively great overall height because the vapour-removal and drying station is arranged substantially above the coating station.

The problem of the present invention is accordingly to remedy the shortcomings of those coating installations of the prior art. In particular, the invention is to provide a method and an apparatus for coating board-shaped piece material, especially printed circuit boards, on both sides, which do not require additional transverse conveyors. The apparatus is to have as short an overall length as possible. In addition, its overall height is to be small and is to be determined essentially only by the overall height of the vertical continuous flow driers.

SUMMARY OF THE INVENTION

The invention proposes a method of coating board-shaped piece material, especially printed circuit boards, on both sides, in which method the printed circuit boards are transported through several consecutive processing stations of a coating installation and, in a first coating station, first one side of the printed circuit boards is wet-coated with preferably UV-hardenable plastics, lacquer or the like, and, after that first side has been coated, the printed circuit boards are subjected to vapour-removal and drying in a first vapour-removal and drying station, the printed circuit boards are turned and, in a second coating station, their second side is wet-coated with preferably UV-hardenable plastics, lacquer or the like, and the printed circuit boards so coated on both sides are subjected to vapour-removal and drying in a second vapour-removal and drying station and are finally transferred from the coating installation to other processing stations for further processing. The method according to the invention comprises especially the following steps: the printed circuit boards are transported in opposite directions through the two coating stations which are arranged side by side in two parallel lines of apparatus, and, in the first vapour-removal and drying station, the printed circuit boards are turned and are transferred from the first line of apparatus to the second. The overall length of the coating installation is thus markedly reduced. Nor are any additional transfer means or transverse conveyors required for the printed circuit boards. The printed circuit boards are turned in the first vapour-removal and coating station, which is arranged transversely to the directions of transport, and are transferred from the first apparatus line with the first coating station to the second apparatus line with the second coating station.

In order to increase the adhesion of the coating to the printed circuit boards and to hasten their drying, it is advantageous to preheat the printed circuit boards in a preheating station at the entrance to the coating installation before they are transported through the first coating station. It is especially advantageous if the preheating station and the second vapour-removal and drying station are formed by a single vapour-removal drier. In that manner, one drier can be dispensed with. After being coated on both sides, the printed circuit boards are, during the final vapour-removal and drying operation in the vapour-removal drier, transferred from the second apparatus line back to the first apparatus line.

At the entrance to the first apparatus line of the coating station, the printed circuit boards are preferably introduced into holding devices which are secured to a descending section of a circulating conveyor, preferably a chain conveyor, which is arranged in the vapour-removal drier, the feed-in plane extending above the transport plane in the first apparatus line, and, after the final vapour-removal and drying, the printed circuit boards are moved out of the descending holding devices of the vapour-removal drier, the delivery plane extending above the feed-in plane.

An especially careful transport of the printed circuit boards is achieved if they are guided or supported substantially constantly at their longitudinal edges during their transport through the individual processing stations of the coating installation and during their transfer to the various transport means of the individual processing stations.

An apparatus for coating board-shaped piece material, especially printed circuit boards, on both sides having a series of processing stations through which the printed circuit boards pass in succession comprises, in the sequence of their arrangement, a first coating station, a vapour-removal and drying station, a second coating station and a second vapour-removal and drying station. The first and the second coating stations are arranged side by side in two parallel apparatus lines. The first vapour-removal and drying station is arranged between the first and the second coating stations in such a manner that its longitudinal extent is transverse to the transport directions of the printed circuit boards in the coating stations. Holding devices for the printed circuit boards, which devices are secured to the ascending section of a circulating conveyor, preferably a chain conveyor, extend across the first apparatus line while holding devices that are secured to the descending section of the circulating conveyor extend across the second apparatus line.

A preheating station for the printed circuit boards is preferably arranged at the entrance to the coating installation, upstream of the first coating station. It is especially advantageous if the preheating station and the second vapour-removal and drying station are formed by a circulating drier, the longitudinal extent of which is parallel to the longitudinal extent of the first vapour-removal and drying station. The circulating drier has a feed-in and a delivery station for the printed circuit boards, which stations are so arranged approximately in line with the first apparatus line in the region of the descending section of the circulating conveyor, preferably a chain conveyor, arranged inside the circulating drier that the feed-in plane extends above the plane of transport of the printed circuit boards in the first coating station and below the delivery plane.

The width of the holding devices for the printed circuit boards in the vapour-removal and drying stations is preferably adjustable to the width of the printed circuit boards. In an especially preferred variant, each holding device comprises two parallel holding rails for the longitudinal edges of the printed circuit boards. One of the holding rails is fixedly connected to the circulating conveyor while the other holding rail is, by means of adjusting means, so displaceable in a parallel, and preferably braked, manner along a guide rod, which extends perpendicularly to the fixed holding rail and is fixedly connected thereto, that the distance between the holding rails can be adjusted to the width of the printed circuit board to be introduced.

For the careful transport of the printed circuit boards which have been coated on one or both sides, it is especially advantageous if the longitudinal edges of the printed circuit boards are held in each coating station by lateral guide means which can be adjusted automatically, by preferably electro-pneumatic adjusting means, to the width of a printed circuit board to be coated, and if the adjusting means for the width adjustment of the carrying elements of the vapour-removal and drying station and the adjusting means for the width adjustment of the lateral guide means for the longitudinal edges of the printed circuit boards in the coating station are coupled to one another.

The complete installation can be constructed in an especially space-saving manner if the first vapour-removal and drying station has an air processing module arranged in a housing which adjoins the feed-in and delivery side of the first vapour-removal drier and extends over the free space above the coating stations. It is especially advantageous if the first vapour-removal and drying station and the second vapour-removal and drying station and, if applicable, the predrying station have a common air processing module. The amount of space required is thus further reduced. The number of supply and removal connections required is likewise reduced. In an ideal situation, only a single vapour-removal connection is necessary, and also one further connection for the energy supply.

In a further variant of the coating installation according to the invention, the coating stations are substantially sealed off from the surrounding air by structural measures, preferably by Plexiglas walls, which extend between the vapour-removal and drying stations and, if applicable, from the lower edge of the housing for the air processing module to the floor.

It is also especially advantageous if the two coating stations arranged side by side have a common pouring table with lateral guide means that can be driven independently of one another for the longitudinal edges of the printed circuit boards in the first coating station and in the second coating station, and if the pouring table has two free-falling pouring curtains of preferably UV-hardenable plastics, lacquer or the like which are supplied by a reservoir arranged above the plane of transport of the printed circuit boards. Thus, only a single pump together with a viscosity- and temperature-regulating system is required for the light-sensitive plastics, lacquer or the like.

BRIEF DESCRIPTION OF THE DRAWINGS

Other especially preferred variants of the method or embodiments of the apparatus according to the invention will be apparent from the description in conjunction with the schematic drawings, in which.

DETAILED DESCRIPTION OF PREFERRED EMBODIMENTS OF THE INVENTION

Figure 1:
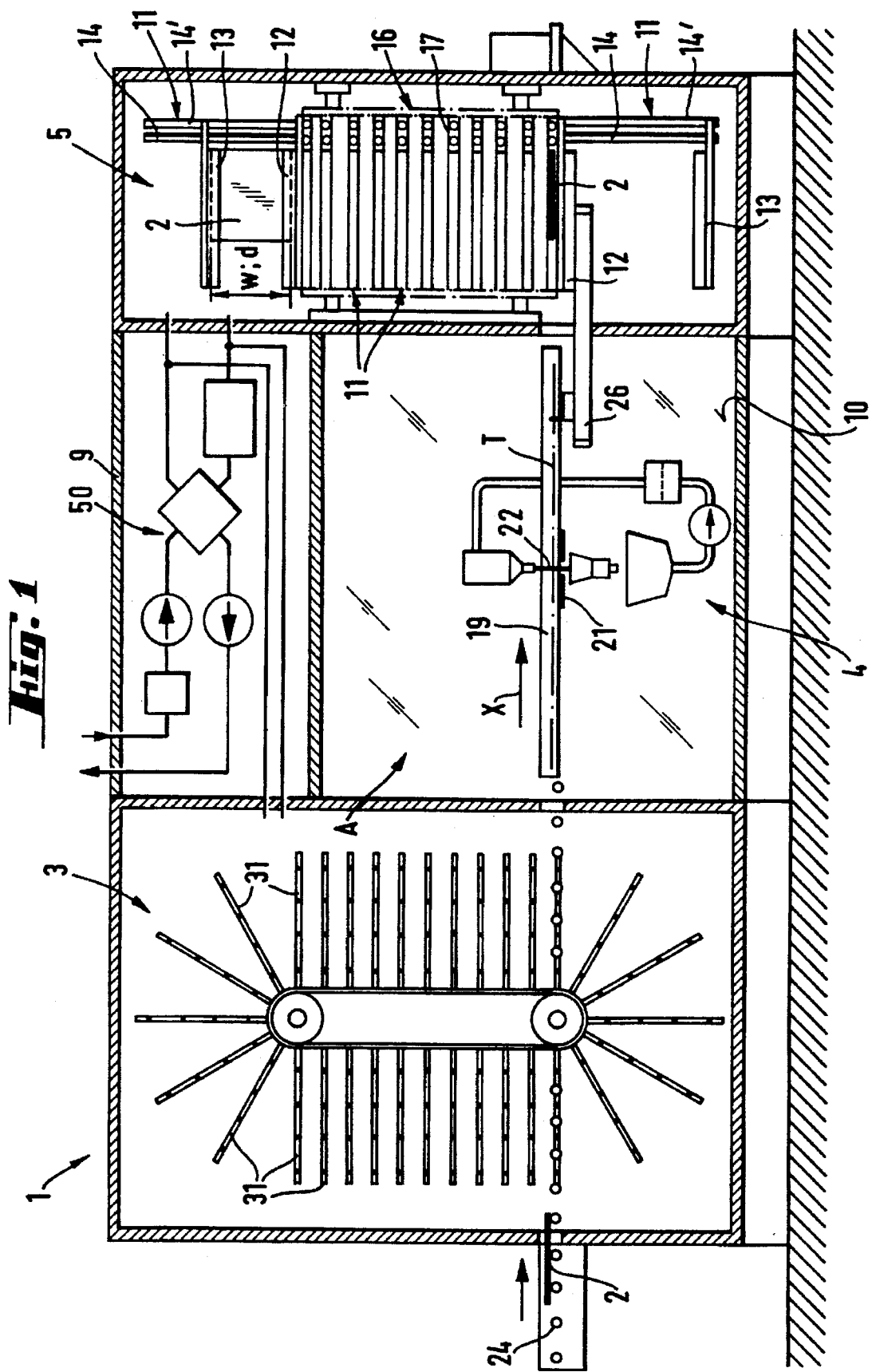
FIG. 1 shows a first embodiment of the coating installation according to the invention partly in longitudinal section.
Figure 2:
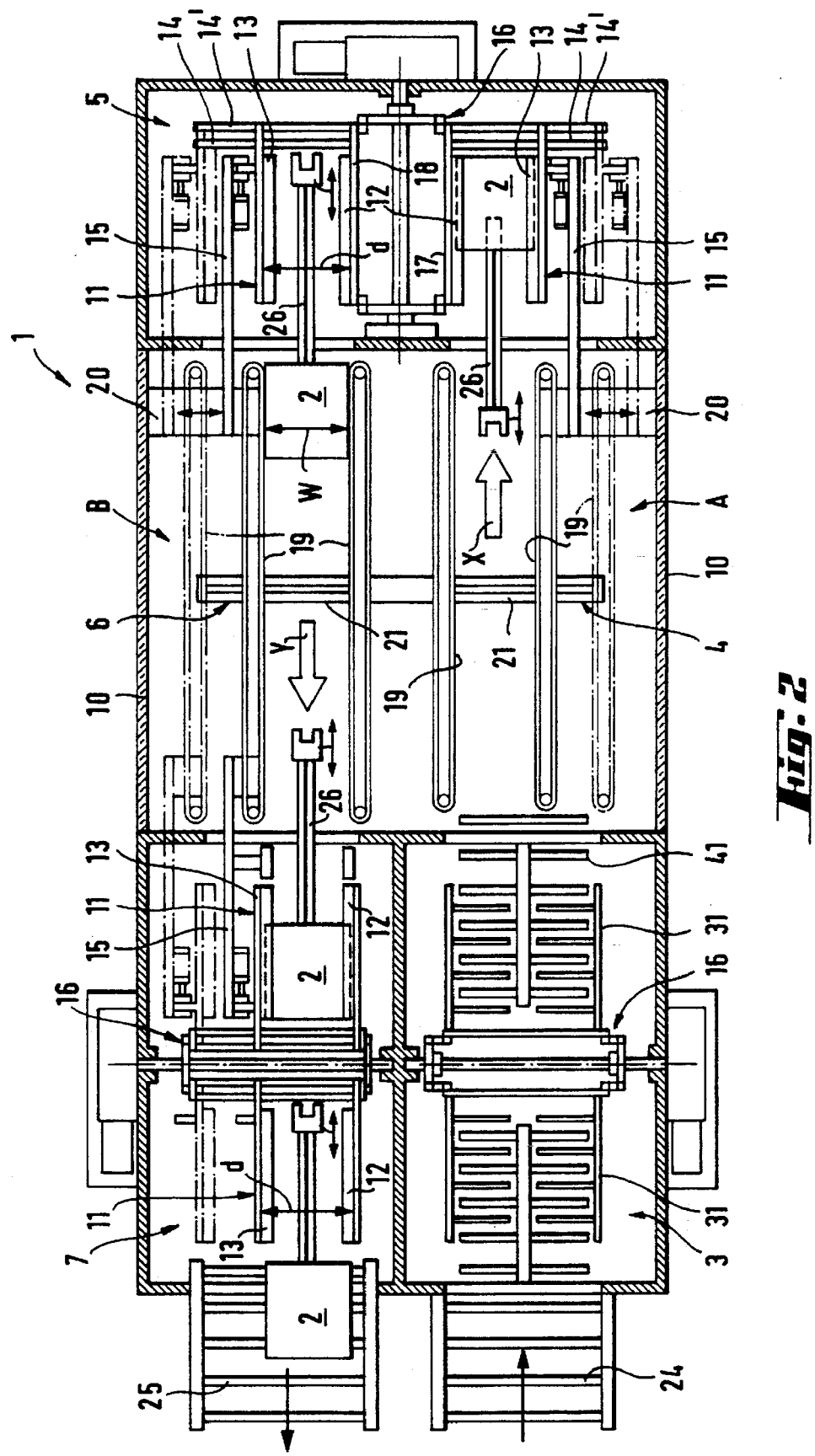
FIG. 2 is a plan view of the coating installation according to FIG. 1 partly in section.

FIGS. 1 and 2 show a first embodiment of the coating installation according to the invention partly in longitudinal section and partly in plan view, respectively. The coating installation has the general reference numeral 1. The coating installation has a series of processing stations for printed circuit boards 2, some of which stations are arranged behind one another and some of which are arranged beside one another in two apparatus lines A and B. In particular, the coating installation in the first apparatus line A comprises a first coating station 4 for coating the printed circuit boards with preferably UV-hardenable plastics, lacquer or the like. The first coating station 4 comprises a pouring table 21 having a pouting head. The pouring head is so constructed that the preferably UV-hardenable plastics, lacquer or the like which is pumped to the pouring head forms a free-falling pouring curtain 22 under which the surfaces of the printed circuit boards 2 to be coated are transported. The lateral extent of the pouring curtain 22, transverse to the direction of transport X of the printed circuit boards 2, is delimited by pouring blades. Such a pouring head is described, for example, in U.S. Pat. No. 4,559,896, the content of which is hereby declared to be an integral part of the present description. The pouring blades ensure that a narrow border along the longitudinal sides of the printed circuit boards 2 remains free of the coating. Preferably, the printed circuit boards 2 are guided in the coating station 4 at their longitudinal edges. For that purpose, lateral guide means 19 are provided in the coating station 4. Those guide means are formed preferably by two laterally arranged conveyor belts, each of which runs round an associated guide bar in the direction of transport X of the printed circuit boards 2. One of the guide bars, preferably the inner one, is arranged to be stationary, while the second guide bar can be adjusted to the width of the printed circuit boards automatically, preferably by electro-pneumatic adjusting means 20. In that manner the printed circuit boards 2 are aligned so that their longitudinal edges extend approximately parallel to the direction of transport X. The conveyor belts grip the longitudinal edges of the printed circuit boards 2 and transport them under the free-failing pouring curtain 22 for the purpose of coating. The pouring blades laterally delimiting the pouring curtain ensure that the conveyor belts do not become soiled.

Beside the first coating station 4, a second coating station 6 is arranged in the second apparatus line B of the coating installation 1. The structure of the second coating station 6 corresponds substantially to that of the first station. The direction of transport Y for the printed circuit boards to be coated extends approximately parallel but counter to the direction of transport X in the first coating station.

A first vapour-removal and drying station is arranged between the first coating station 4 and the second coating station 6. The arrangement of the first vapour-removal and drying station 5 is such that its longitudinal extent is approximately transverse to the directions of transport X and Y of the printed circuit boards 2 in the coating stations 4 and 6, respectively. The first vapour-removal and drying station 5 comprises a circulating conveyor 16 which is preferably constructed as a chain conveyor. The circulating conveyor is equipped with holding devices 11 each of which has two holding mils 12, 13 for the longitudinal edges of the printed circuit boards 2. A fixed holding rail 12 is fixedly connected to the circulating conveyor, for example to endless circulating chains of a chain conveyor. The second holding rail 13 is displaceable parallel to the fixed guide rail 12 along a guide rod 14 which extends outwards from the fixed holding rail. A second guide rod 14' serves to support the displaceable holding rail. In that manner, the distance d between the two holding rails 12, 13 of each holding device 11 can be adjusted to the width w of the printed circuit boards 2. The displaceable holding rail 13 preferably has a braking device, for example a spring-loaded brake shoe, which is pressed against the guide rod 14 and, on the one hand, brakes the adjustment and, on the other, secures the displaceable holding rail against inadvertent spontaneous displacement. The adjustment of the displaceable holding rail 13 is effected at the ascending section 17 of the circulating conveyor 16, preferably by electro-pneumatic adjusting means 15. It is especially advantageous to couple the adjusting means 15 for the displaceable holding rail 13 to the adjusting means 20 for the lateral guide means 19 for the printed circuit boards 2 in the first coating station 4. The holding rails 12, 13 preferably have a V-shaped or U-shaped cross-section or are provided with a longitudinal groove in order to receive the longitudinal edges of the printed circuit boards 2. The insertion and removal of the printed circuit boards 2 into and out of the holding devices 11 is effected by means of draw-in and delivery means 26, respectively, which are arranged below the plane of transport T of the printed circuit boards 2 in the coating stations 4 and 6, respectively, and which can be operated preferably electro-pneumatically. The first vapour-removal and drying station 5 is so arranged that the holding devices 11 for the printed circuit boards 2, which devices are secured to the ascending section 17 of the circulating conveyor 16, preferably of a chain conveyor, extend across the first apparatus line A while the holding devices 11 that are secured to the descending section 18 of the circulating conveyor 16 extend across the second apparatus line B.

Arranged after the second coating station 6 is a second vapour-removal and drying station 7 to which the printed circuit boards 2 are transferred when the second side has been coated. In the embodiment shown in FIGS. 1 and 2, the second vapour-removal and drying station 7 is arranged longitudinally in the second apparatus line B, that is to say, its longitudinal extent runs parallel to and lies in the second apparatus line B. The second vapour-removal and drying station 7 preferably also has holding devices 11 for the printed circuit boards 2, which devices comprise two holding rails, one fixed in position 12 and one displaceable 13, of which the distance d from one another can be adjusted to the width w of the printed circuit boards 2. Again, adjusting means 15 which can be operated preferably electro-pneumatically are provided for the displaceable holding rail 13. The adjusting means 15 for the displaceable holding rail 13 are preferably coupled to the adjusting means 20 for the lateral guide means 19 for the longitudinal edges of the printed circuit boards 2 in the second coating station 6. That coupling may be of a type known in control engineering but may also be a simple mechanical connection. For example, the adjusting means 20 for the lateral guide means 19 in the second coating station 6 have an adjusting arm which is displaceable together with the adjustable guide means 19 and can be caused to engage the adjusting means 15 for the displaceable holding rail 13. The insertion and removal of the printed circuit boards 2 into and out of the holding devices 11 is effected by means of draw-in and delivery means 26, respectively, which are arranged below the plane of transport T of the printed circuit boards 2 in the coating stations 4 and 6, respectively, and which can be operated preferably electro-pneumatically. At the exit of the second vapour-removal and drying station 7, the printed circuit boards, which have been coated and dried on both sides, are deposited, for example, on a delivery roller conveyor 25 by which they can be transported to other processing apparatuses.

The coating installation 1 according to the invention shown by way of example in FIGS. 1 and 2 for coating both sides of board-shaped piece material, especially printed circuit boards 2, has a preheating station 3 at the entrance to the coating installation 1, upstream of the first coating station 4. That preheating station likewise has holding devices 31 for the printed circuit boards 2 which can be introduced into those devices by a feed-in roller conveyor 24. The preheating station 3, like the vapour-removal and drying stations 5 and 7, comprises a circulating conveyor 16. The preheating station has a substantially vertically orientated structure. The approximately horizontally projecting holding devices 11 are transported vertically upwards, flipped over at the top turn-round site so that the boards 2 in the holding devices 11 are turned, and transported vertically downwards again, projecting approximately horizontally from the chains or cables or similar conveyor elements of the circulating conveyor 16. At the exit of the preheating station 3, the printed circuit boards 2 are deposited on a transfer roller conveyor 41, which constitutes the entrance to the first coating station. The printed circuit boards are then transported under the pouring curtain 22 with the aid of the lateral guide means 19.

The printed circuit boards 2 are transported through the individual successive processing stations of the coating installation 1 in order to be coated on both sides. When the printed circuit boards 2 have been pre-heated in the preheating station 3, first one side of the printed circuit boards 2 is wet-coated with preferably UV-hardenable plastics, lacquer or the like in the first coating station 4. When the first side has been coated, the printed circuit boards are subjected to vapour-removal and drying in the first vapour-removal and drying station 5. During that operation, the printed circuit boards 2 are turned and their second side is wet-coated with preferably UV-hardenable plastics, lacquer or the like in the second coating station. The printed circuit boards 2 so coated on both sides are subjected to vapour-removal and drying in the second vapour-removal and drying station 7 and finally transferred from the coating installation 1 to other processing stations for the purpose of further processing. In the two coating stations 4 and 6 arranged side by side, the printed circuit boards are transported in directions X and Y, respectively, which are parallel but counter to one another. The transfer of the printed circuit boards 2 from the first coating station 4 in the first apparatus line A to the second coating station 6 in the second apparatus line B is effected by means of the first vapour-removal and drying station 5. The printed circuit boards are turned in that station and transferred from the first apparatus line A to the second B transversely to the directions of transport X, Y in the coating stations 4, 6. The overall length of the coating installation is thus markedly reduced. Nor is it necessary to provide additional transfer means or transverse conveyors for the printed circuit boards.

A particular advantage of the coating installation 1 according to FIG. 1 and 2 is that the printed circuit boards 2 are guided or supported substantially constantly at their longitudinal edges during their transport from the first coating station 4 via the first vapour-removal and drying station 5 to the second coating station 6 and finally through the second vapour-removal and drying station 7 and during their transfer to the various transport means in the individual stations.

Figure 3:
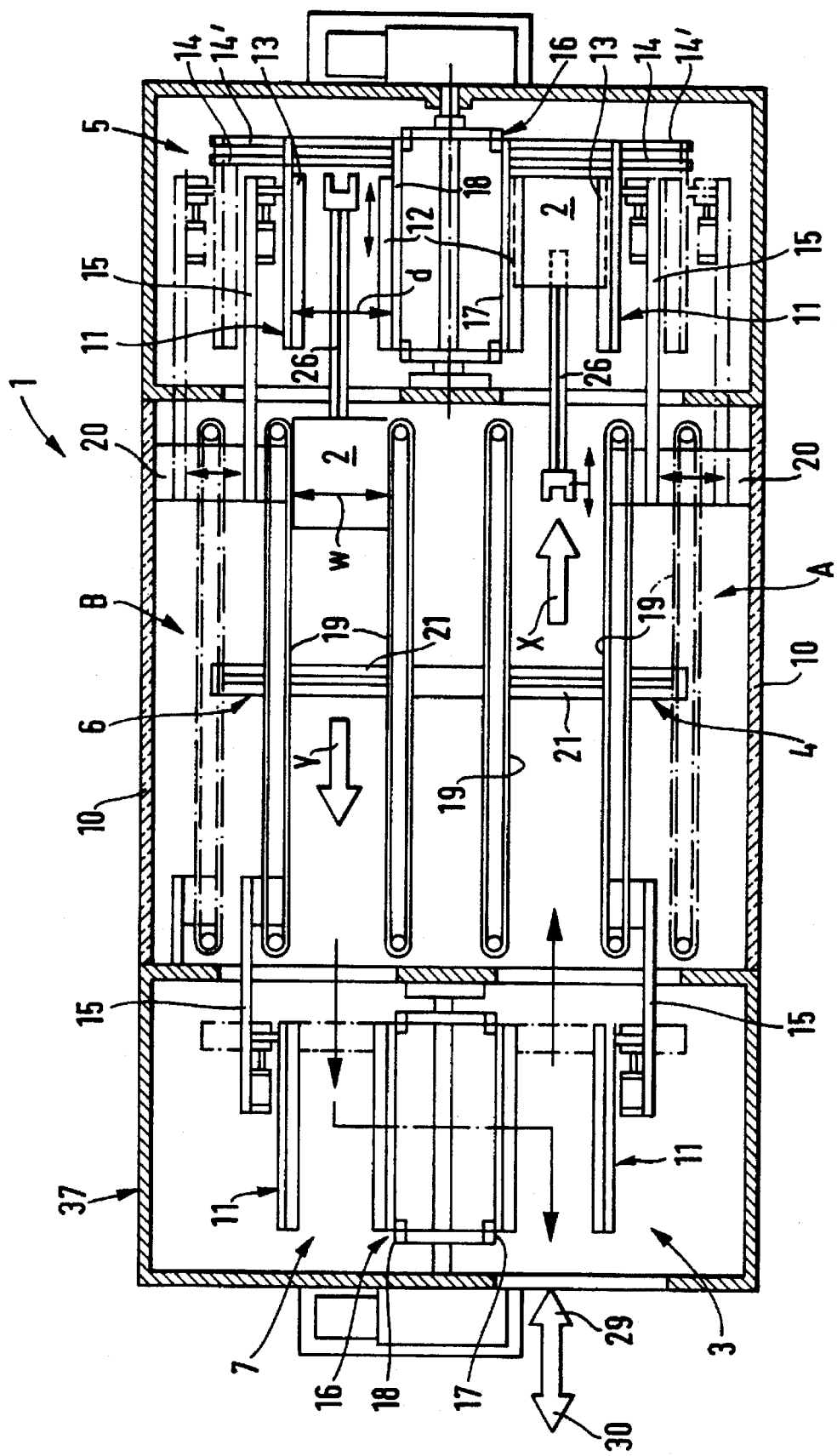
FIG. 3 is a plan view of a second embodiment of the coating installation according to the invention partly in section.

FIG. 3 shows a second embodiment of the coating installation 1 according to the invention for coating printed circuit boards on both sides. It corresponds substantially to the installation shown in FIGS. 1 and 2. The most important difference is that the pre-heating station 3 at the entrance and the vapour-removal and drying station 7 at the exit have been combined to form a single circulating drier 37. The circulating drier 37 is so arranged that its longitudinal extent runs parallel to the longitudinal extent of the first vapour-removal and drying station 5. That is to say, it runs transversely, preferably at a 90° angle, to the directions of transport X, Y of the printed circuit boards 2 in the coating stations 4, 6. The structure of the circulating drier 37 corresponds substantially to the structure of the first vapour-removal and drying station 5. In particular, it also may have holding devices 11 which comprise a fixed holding rail 12 and a displaceable holding rail 13 so that the width d of the holding devices 11 can be adjusted to the width w of the printed circuit boards to be inserted.

Unlike the first vapour-removal and drying station 5, which has a feed-in opening in the projection of the first apparatus line A and a delivery opening in the projection of the second apparatus line B for the printed circuit boards 2, which openings are arranged on the same longitudinal side of the station, the circulating drier 37 has, in the projection of the first apparatus line A, on the longitudinal side remote from the coating stations 4, 6, a feed-in and a delivery station for the printed circuit boards 2. In FIG. 3, the feed-in station is indicated by the arrow 29 and the delivery station is indicated by the arrow 30. The feed-in station 29 is arranged above the plane of transport of the printed circuit boards 2 in the coating stations 4, 6. Printed circuit boards 2 which are fed via the feed-in station 29 into holding devices 11 at the descending section 17 of the circulating conveyor 16 are preheated during downward transport and, when they reach the level of the plane of transport of the printed circuit boards in the coating stations, they are moved out into the first coating station 4 lying opposite. The printed circuit boards 2 coated on both sides which, coming from the second coating station 6, are fed into holding devices 11 at the ascending section 18 of the circulating conveyor 16 are dried during their transport through the circulating drier, turned during that operation and conveyed out of the coating installation 1 via the delivery station 30 which is arranged above the feed-in station 29.

Indicated above the first coating station 4 in FIG. 1 is a housing 9 which extends from the preheating station 3 as far as the first vapour-removal and drying station 5 arranged transversely to the direction of transport of the printed circuit boards. It will be understood that the housing 9 also extends rearwards into the plane of the drawing, so that it extends above the two coating stations 4, 6 from the pre-heating station 3 and the second vapour-removal and drying station 7 as far as the first vapour-removal and drying station 5. The dimensions of the housing 9 are preferably such that it does not project beyond the width and the height of the first vapour-removal and drying station 5. Accommodated inside the housing 9 is an air processing module 50 which supplies the circulating drier of the pre-heating station 3, and also of the first and second vapour-removal and drying stations 4, 6, with hot air of the desired temperature and receives the vapour removed by suction and, where appropriate, processes it.

FIGS. 1 to 3 also show sealing walls 10 which substantially seal off the coating stations 4, 6 from the surroundings. Those sealing walls 10 are preferably Plexiglas walls which extend between the combined preheating and vapour-removal and drying stations 37 and the first vapour-removal and drying station 5 or between the preheating station 3 and the second vapour-removal and drying station 7, on the one hand, and the first vapour-removal and drying station 5, on the other. As shown in FIG. 1, the sealing walls 10 extend on both sides of the coating stations 4, 6 from the lower edge of the housing 9 for the air processing module approximately as far as the floor. If the space above the coating stations 4, 6 is not used to accommodate the housing for the air processing module and is free, the two sealing walls 10 are connected by a cover plate so that the coating stations 4, 6 are located inside a kind of tunnel which extends over the entire length of the coating stations and is delimited on the one hand by the preheating station 3 and the second vapour-removal and drying station 7 or by the combined circulating drier 37, and on the other hand by the first vapour-removal and drying station 5. The necessary clean-room volume can thus be restricted to the volume inside the tunnel; it is no longer necessary for the air volume of the entire room in which the coating installation 1 is accommodated to be brought up to the desired clean-room quality.

Each of the coating stations 4, 6 may have its own pouring table with all the necessary components, such as, for example, pumps, reservoir for the preferably UV-hardenable plastics, lacquer or the like, pouting head with separating blades etc. They preferably have a common pouring table 21 with lateral guide means 19 for the longitudinal edges of the printed circuit boards 2 to be coated, which guide means can be driven and adjusted in width independently of one another. The pouring table is so constructed that it produces two free-falling pouring curtains which are arranged side by side and each of which extends approximately transversely to the direction of transport X, Y of the printed circuit boards 2 in the respective coating station 4, 6. The pouring curtains are supplied by a single, common reservoir which is arranged above the pouring table. In that manner only a single pump together with a viscosity- and temperature-regulating system for the light-sensitive plastics, lacquer or the like is necessary.

It will be understood that the coating installation 1 according to the invention is not limited only to the described embodiments. The essence of the invention covers other variants not expressly discussed. The invention has been explained using two coating installations for printed circuit boards as examples. That is not, however, to be understood as being limiting. The coating installation according to the invention can be used quite generally for coating both sides of board-shaped piece material with a desired coating material. Nor is the coating operation limited only to wet-coating with liquid coating materials.

The invention provides a method and an apparatus for coating board-shaped piece material, especially printed circuit boards, on both sides, which method and apparatus do not require additional transverse conveyors. The apparatus is compact and has a relatively short overall length. The overall height of the complete installation is also relatively small and is determined essentially only by the overall height of the vertical continuous flow driers.

What is claimed is:

1. An apparatus for coating printed circuit boards on both sides, said apparatus having a series of processing stations through which the printed circuit boards are transported in succession, which processing stations comprise, in the sequence of their arrangement, (1) a first coating station, (2) a first vapour-removal and drying station, (3) a second coating station, and (4) a second vapour-removal and drying station, wherein a preheating station for the printed circuit boards is arranged at the entrance to the apparatus upstream of the first coating station, the first and the second coating stations are arranged side by side in first and second parallel apparatus lines which transport the printed circuit boards in opposite directions, the first vapour-removal and drying station is arranged between the first and the second coating stations in such a manner that its longitudinal extent is transverse to said parallel apparatus lines, and wherein the first vapour-removal and drying station comprises a circulating conveyor having an ascending section, a descending section and holding devices for the printed circuit boards secured to said ascending and descending sections, wherein said holding devices that are secured to the ascending section extend across the first parallel apparatus line while the holding devices that are secured to the descending section extend across the second parallel apparatus line, the second vapour-removal and drying station also has holding devices for the printed circuit boards and is positioned and arranged at an exit of the apparatus, the preheating station at the entrance of the apparatus and the second vapour-removal and drying station at an exit of the apparatus are combined to form a single circulating drier having a longitudinal axis that is parallel to the longitudinal axis of the first vapour-removal and drying station, and wherein the circulating drier has a feed-in and a delivery station for the printed circuit boards and a circulating conveyor arranged therein having ascending and descending sections, which feed-in and delivery stations are arranged approximately in line with said first parallel apparatus line in the region of the descending section of the circulating conveyor of said circulating drier such that the plane of the feed-in station extends above the plane of the first parallel apparatus line in the first coating station and below the plane of the delivery station.

2. An apparatus according to claim 1, wherein the width of the holding devices for the printed circuit boards in the vapour-removal and drying stations are adjustable to the width of the printed circuit boards.

3. An apparatus according to claim 2, wherein each holding device comprises two parallel holding rails for the longitudinal edges of the printed circuit boards, wherein one of the holding rails is fixedly connected to a respective circulating conveyor while the other holding rail is displaceable parallel to the fixed holding rail along a guide rod, which guide rod extends perpendicularly to the fixed holding rail and is fixedly connected thereto, and wherein the distance between the holding rails can be adjusted to the width of the printed circuit board to be introduced by electro-pneumatic adjusting means.

4. An apparatus according to claim 3, wherein the printed circuit boards are held in each coating station by lateral guide means which hold the longitudinal edges of the printed circuit boards and which can be adjusted automatically to the width of a printed circuit board to be coated by electro-pneumatic adjusting means, and wherein the electro-pneumatic adjusting means for the width adjustment of the holding devices of the vapour-removal and drying stations and the electro-pneumatic adjusting means for the width adjustment of the lateral guide means for the longitudinal edges of the printed circuit boards in the coating stations are coupled to one another.

5. An apparatus according to claim 4, wherein the two coating stations arranged side by side have a common pouring table with lateral guide means, which lateral guide means can be driven independently of one another in the first coating station and in the second coating station, and the pouring table has two free-failing pouting curtains which are supplied by a common reservoir arranged above the parallel apparatus lines.

6. An apparatus according to claim 1, wherein the first and the second coating stations have free space above the parallel apparatus lines, and the first vapour-removal and drying station has an air processing module arranged in a housing which adjoins an entrance side of the first vapour-removal and drying station and extends over the free space above the parallel apparatus lines.

7. An apparatus according to claim 6, wherein said air processing module is common to the first vapour-removal and drying station, the second vapour-removal and drying station and the preheating station and is arranged in a housing having upper and lower edges which adjoins the vapour-removal and drying stations and extends between the vapour-removal and drying stations over the free space above the parallel apparatus lines.

8. An apparatus according to claim 7, wherein the coating stations are substantially sealed off from the surrounding air by structural measures which extend between the vapour-removal and drying stations and down from the lower edge of the housing for the air processing module.

* * * * *